(12) United States Patent
Riondet et al.

(10) Patent No.: US 7,432,778 B2
(45) Date of Patent: Oct. 7, 2008

(54) ARRANGEMENT AND METHOD IMPEDANCE MATCHING

(75) Inventors: Philippe Riondet, Gif-sur Yvette (FR); Gilles Montoriol, Gif-sur Yvette (FR); Jacques Trichet, Gif-sur Yvette (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/465,843

(22) Filed: Aug. 21, 2006

(65) Prior Publication Data

US 2007/0159266 A1  Jul. 12, 2007

Related U.S. Application Data

(62) Division of application No. 10/468,178, filed on Aug. 18, 2003, now Pat. No. 7,113,054.

(51) Int. Cl.
*H03H 7/38* (2006.01)
(52) U.S. Cl. .......................... 333/33; 333/247
(58) Field of Classification Search .................. 333/32, 333/33, 246, 247, 245; 257/664, 773
See application file for complete search history.

(56) References Cited

U.S. PATENT DOCUMENTS

| | | | |
|---|---|---|---|
| 3,555,375 A | 1/1971 | Hilbers | |
| 3,784,883 A | 1/1974 | Duncan et al. | |
| 3,893,159 A | 7/1975 | Martin | |
| 5,471,089 A | 11/1995 | Nagatomo et al. | |
| 5,805,023 A | 9/1998 | Fukuden | |
| 5,969,929 A | 10/1999 | Kleveland et al. | |
| 6,448,865 B1 * | 9/2002 | Miller | 333/33 |

FOREIGN PATENT DOCUMENTS

| | | |
|---|---|---|
| EP | 0578108 B1 | 6/1998 |
| JP | 1992082846 A | 7/1992 |
| JP | 1994021323 A | 1/1994 |
| JP | 1998256850 | 9/1998 |

* cited by examiner

*Primary Examiner*—Stephen E Jones

(57) ABSTRACT

An arrangement and method for impedance matching (e.g., for a power amplifier) comprising a first node (204a) for receiving an output current to be impedance matched; a second node (212, 214) for receiving output current from the first node; a first current conductor (202c) for carrying current from the first node to the second node; a third node (204b) for receiving output current from the second node; and a second current conductor (202d) for carrying current from said second node to said third node, whereby the first and second current conductors are closely positioned so that their inductance is the sum of their self-inductances and the negative sum of their mutual inductance. The current conductors may be wire bonds, the arrangement may include a capacitor integrated in a power amplifier IC module, in which the capacitor may be provided in a separate IC from the power amplifier, the arrangement may utilize a plurality of impedance matching cells, and the wire bonds may be interdigitated across the semiconductor die. This provides the following advantages: easy to implement; increased accuracy of matching; requires few external components; easy to manufacture; no need for dedicated design flow; requires only standard IC production and test tools; uses low loss matching networks; involves only a small increase in die size (due to integration of capacitor), but the total size of the solution may be significantly reduced (e.g., by 50%) because of the reduced number of external components.

2 Claims, 3 Drawing Sheets

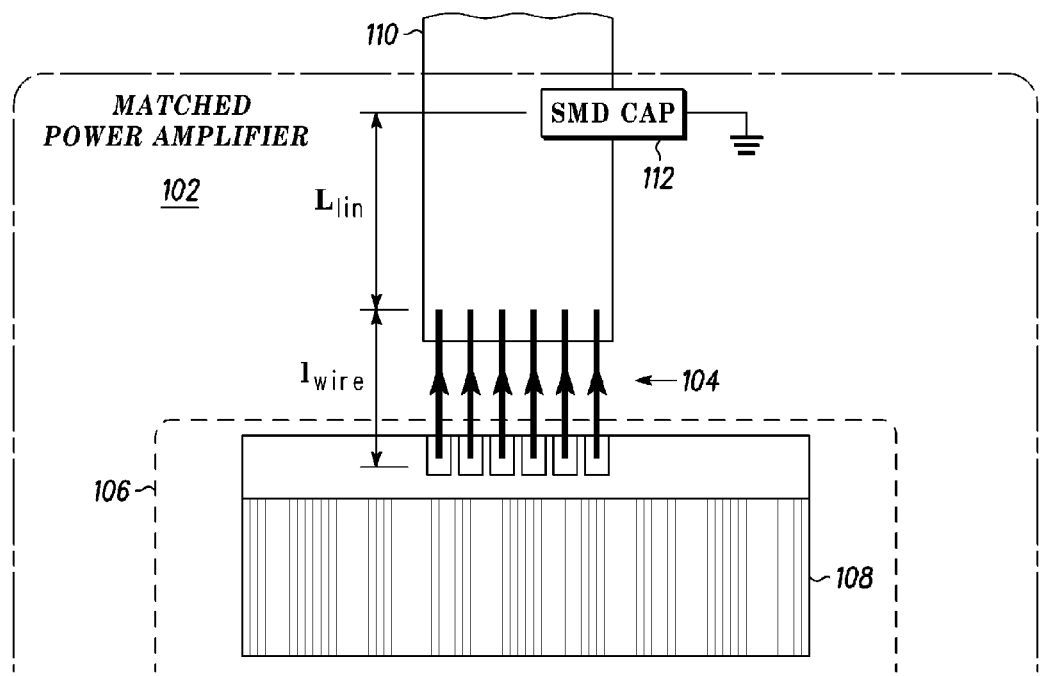
FIG. 1 - PRIOR ART -
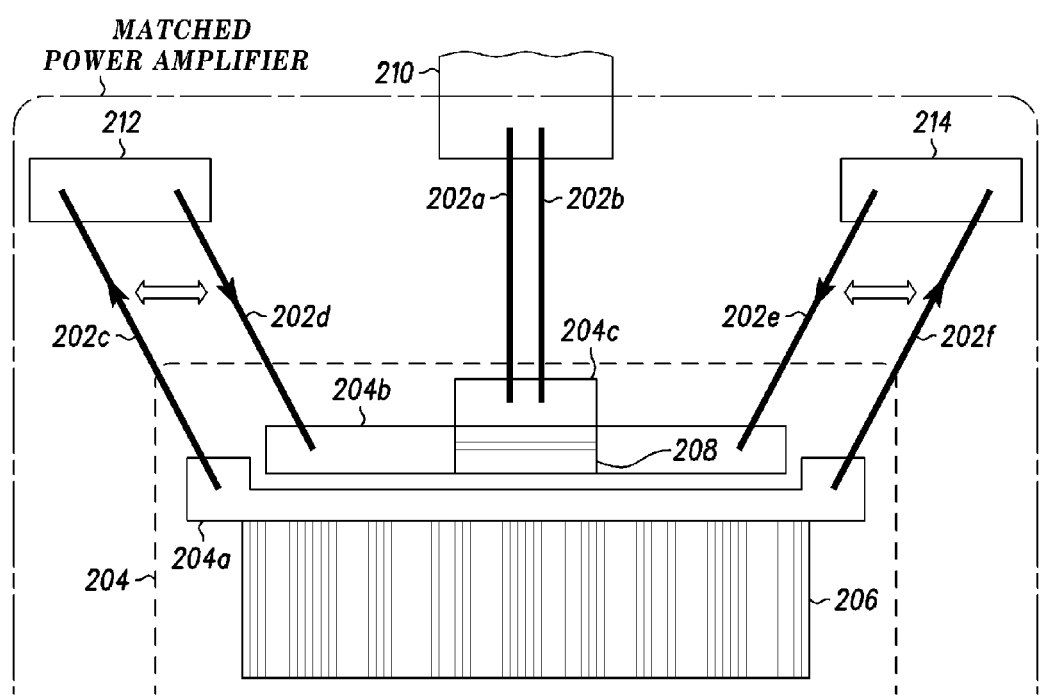
FIG. 2

ARRANGEMENT AND METHOD IMPEDANCE MATCHING

FIELD OF THE INVENTION

This invention relates to impedance matching, and particularly though not exclusively to impedance matching of power amplifiers.

BACKGROUND OF THE INVENTION

In the field of this invention it is known that for optimum transfer of energy, from devices such as power amplifiers, the output impedance of the power amplifier should match the input impedance of circuitry driven by the power amplifier. In practice, the output impedance of a power amplifier such as an integrated circuit (IC) power amplifier (PA) is typically matched by use of an electrical/electronic network including components such as inductors and capacitors mounted externally to the IC and connected to the IC by wires. Wire-bonding is typically used to connect the wires. Capacitors may be metal-oxide-semiconductor capacitors (MOSCAPs) or Surface Mounted Device (SMD) capacitors. Inductors are generally made with transmission lines, such as microstrip or coplanar lines, shunted to ground at a precise position by the abovementioned capacitors.

However, this approach has the disadvantage(s) that the SMD capacitors have, for cost purpose, a poor quality factor which results in losses and a non-negligable series parasitic inductance that narrows the bandwidth, as well as a large tolerance which degrades the PA RF performance deviation over a number of performance parameters. In addition, such SMD capacitors, as they are automatically picked and placed, have minimum spacing specifications in order to fit the assembling machine constraints, thus contributing to increase the overall Power Amplifier application size.

A need therefore exists for impedance matching wherein the abovementioned disadvantage(s) may be alleviated.

STATEMENT OF INVENTION

In accordance with a first aspect of the present invention there is provided an arrangement for impedance matching as claimed in claim 1.

In accordance with a second aspect of the present invention there is provided a method for impedance matching as claimed in claim 13.

BRIEF DESCRIPTION OF THE DRAWINGS

Four arrangements and methods for impedance matching incorporating the present invention will now be described, by way of example only, with reference to the accompanying drawings, in which:

FIG. 1 shows a schematic part-cross-sectional diagram of a known arrangement for impedance matching;

FIG. 2 shows a schematic part-cross-sectional diagram of a first novel arrangement, incorporating the present invention, for impedance matching;

DESCRIPTION OF PREFERRED EMBODIMENT

Figure 3:
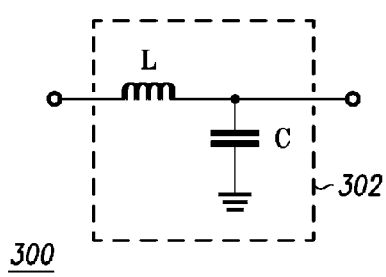
FIG. 3 shows a block-schematic diagram of an equivalent electrical circuit for the arrangement of FIG. 2.

Referring firstly to FIG. 1, a known impedance matching arrangement 100 for a power amplifier 102 (such as a module dual-band PA for use in cellular radio applications) has a number of wires 104 attached by conventional wire-bonding techniques between an IC 106 with an RF power transistor 108 to be matched and a printed transmission line 110. An external surface-mount device (SMD) capacitor 112 is connected between earth/ground and a precise position on the printed transmission line 110 remote from the wires 104.

In this arrangement it will be appreciated that the inductor ($L_{lin}+l_{wire}$) is realised with the printed transmission line 110, the length of which determines the inductance value $L_{line}$, and the inductance from the wires which determines the inductance value $l_{wire}$. The length of the printed transmission line 110 is defined by the precise position of the SMD capacitor 112. Such an arrangement constitutes a matching cell that increases the output impedance of the RF power transistor 108. Typically in practice, the use of only one impedance matching cell does not allow the output impedance to reach a typical desired value of 50 Ohms (from an unmatched of typically 3 Ohms) without degrading the RF performance of the Power Amplifier 102. An additional matching cell is then needed and a second SMD capacitor is connected between earth/ground and a second precise position on the printed transmission line 110 remote from the first. For a dual-band power amplifier application, one so-described arrangement is needed for each band.

In this approach, it will be appreciated that the length of the printed transmission lines, that have a low inductivity due to their width, as well as the use of SMD capacitors, that need to meet the component-to-component spacing required by the automatic pick-and-place machine, contribute to increase drastically the size and then the cost of the power amplifier application.

Moreover, SMD capacitors have, for cost reasons, a poor quality factor which results in losses and a non-negligible series parasitic inductance that narrows the bandwidth, as well as a large tolerance which degrades the PA RF performance deviation over a number of performance parameters.

Referring now to FIG. 2, a first novel impedance matching arrangement 200 for a dual-band cellular radio power amplifier module has a number of wires 202*a*-202*f* attached by conventional wire-bonding techniques between an IC 204 on which is the RF power transistor 206 (to be matched) and an integrated capacitor 208 and respectively: a printed transmission line 210, a first bonding zone pad 212 and a second bonding zone pad 214.

The printed transmission line 210, the first bonding zone pad 212 and the second bonding zone pad 214 are each connected to the IC 204 (at respective layers 204*a*, 204*b*, 204*c* thereof) by two wires 202: the printed transmission line 210 (which may be a coplanar or microstrip transmission line) being connected to the integrated capacitor 208 at the IC layer 204*c* by two wires 202*a* and 202*b*, the first bonding zone pad 212 being connected to the RF power transistor 206 at the IC layer 204*a* by a wire 202*c* and to the integrated capacitor 208 at IC layer 204b by a wire 202d, and the second bonding zone pad 214 being connected to the integrated capacitor 208 at the IC layer 204b by a wire 202e and to the RF power transistor 206 at the IC layer 204a by a wire 202f. As will be explained in greater detail below, in the pairs of wires (202c & 202d, 202e & 202f) one wire (202c, 202f) carries RF current from the RF power transistor 206 on the IC 204, and the other wire (202d, 202e) carries RF current to the integrated capacitor 208 on the IC 204. It will be understood that in practice, for increased current carrying capacity, the wires described individually as 202a, 202b, 202c, 202d, 202e and 202f may actually be groups of wires, with each group having two individual wires or more.

In the impedance matching arrangement 200 it will be appreciated that the pairs of wires (202c & 202d, 202e & 202f) carry RF current in anti-parallel, and so create a mutual inductance therebetween which adds negatively to the self-inductance of the wires to produce the resultant inductance of the coupling. It will be appreciated that the effect of this negative addition results in a lowering of the resultant inductance of each pair of wires (compared to the known arrangement of FIG. 1), and it will be further appreciated that this results in the possibility to achieve low inductance values that are typically needed for the first matching cell. In addition, the symmetrical geometry of the arrangement of FIG. 2 provides the RF power transistor 206 with thermally and electrically well-balanced working conditions.

It will be appreciated that although the invention has been described above with reference to matching the output impedance of a power amplifier, the invention could alternatively be used in interstage matching networks in the case of multistage amplifiers.

Referring now to FIG. 3, the equivalent electrical circuit 300 of the impedance matching arrangement 200 has a matching cell 302 constituted by the inductance L generated by putting in parallel the inductances Lcd and Lef realized respectively by the pairs of wires (202c & 202d) and (202e and 202f), and a capacitor C (which is integrated on the same die as the PA IC).

Figure 4:
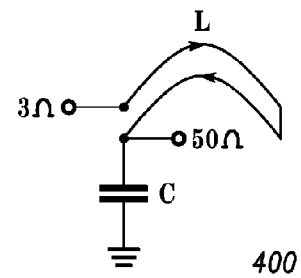
FIG. 4 shows a pictorial representation of a part of circuit of FIG. 3.

Referring now to FIG. 4, the pictorial representation 400 of the matching cell 302 shown demonstrates that the arrangement uses no external components, since the capacitor C is integrated into the IC die and the inductances are constituted by the pairs of wires 202 as described above. It will therefore be understood that the impedance matching arrangement 200 can provide high Q elements, a small die size and requires a reduced number of external components compared to the known arrangement of FIG. 1.

Figure 5:
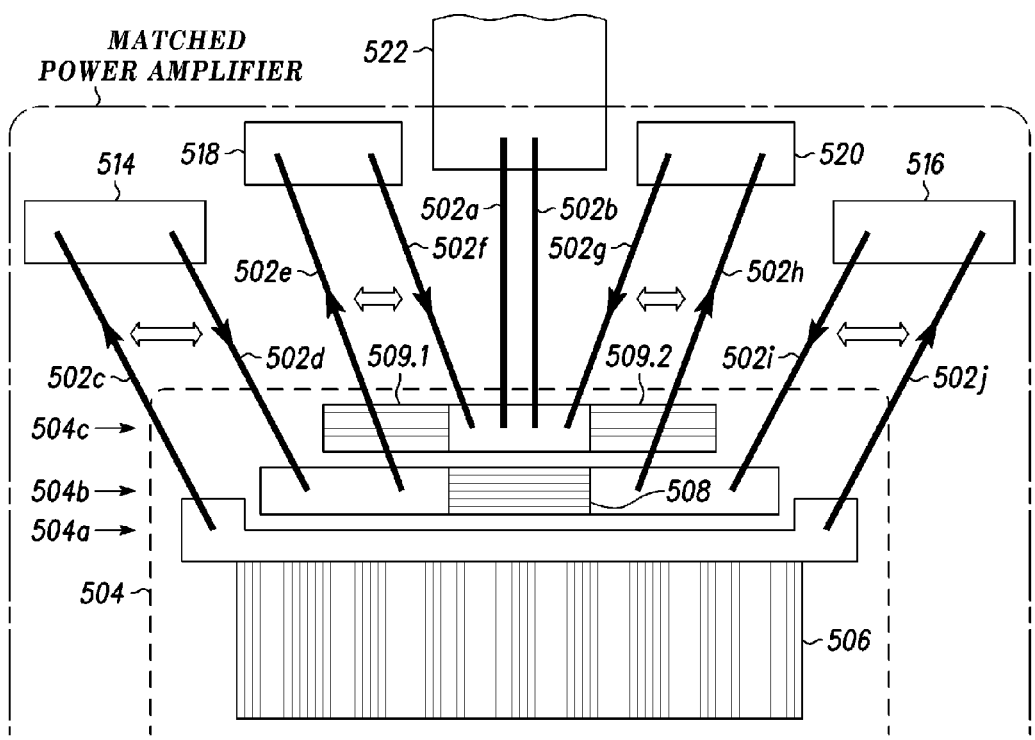
FIG. 5 shows a schematic part-cross-sectional diagram of a second novel arrangement utilising two impedance matching cells, incorporating the present invention, for impedance matching.

Referring now to FIG. 5, a second novel impedance matching arrangement 500, similar to that of FIG. 2, for a dual-band cellular radio power amplifier module utilises two impedance matching cells. In the two cell arrangement 500 a number of wires 502a-502j are attached by conventional wire-bonding techniques between an IC 504 (at respective 504a, 504b and 504c thereof) on which is the RF power transistor 506 to be matched and integrated capacitors 508 and 509 (shown in two parts 509.1 and 509.2), and respectively: a printed transmission line 522, a first bonding zone pad 514 and a second bonding zone pad 516, a third bonding zone pad 518 and a fourth bonding zone pad 520.

The first bonding zone pad 514 and the second bonding zone pad 516 are each connected to receive RF current from the IC 504 at IC layer 504a by wires 502c and 502j respectively; the first bonding zone pad 514 and the second bonding zone pad 516 are each connected to send RF current by wires 502d and 502i respectively to the layer 504b of the IC 504 incorporating the integrated capacitor 508. The third bonding zone pad 518 and the fourth bonding zone pad 520 are each connected to receive RF current by wires 502e and 502h respectively from the layer 504b of the IC 504 incorporating the integrated capacitor 508; the third bonding zone pad 518 and the fourth bonding zone pad 520 are each connected to send RF current by wires 502f and 502g respectively to the layer 504c of the IC 504 incorporating the integrated capacitor 509, which is connected by wires 502a and 502b to the printed transmission line 522.

In the impedance matching arrangement 500 it will be appreciated that the pairs of wires (202c & 202d, 202e & 202f, 202g & 202h, 202i & 202j) carry RF current in anti-parallel, and so create a mutual inductance therebetween which adds negatively to the self-inductance of the wires to produce the resultant inductance of the coupling, as in the arrangement 200 of FIG. 2, with the same advantages as explained above. It will be further appreciated that since the arrangement 500 incorporates two impedance matching cells (514, 502c, 502d, 516, 502i, 502j, 508 and 518, 502e, 502f, 520, 502g, 502h, 509 respectively) this allows the output impedance of the power amplifier 504 to be more efficiently increased from a typical value of 3Ω to a desired value of 50Ω than with the single cell arrangement 200 of FIG. 2.

Figure 6:
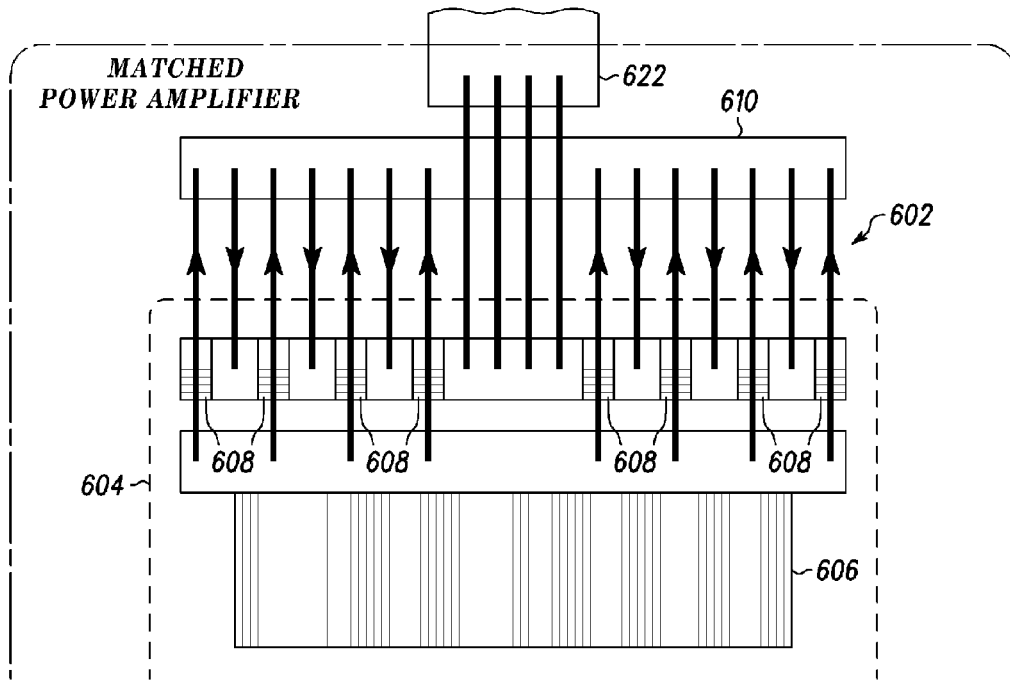
FIG. 6 shows a schematic part-cross-sectional diagram of a third novel arrangement similar in principle to that of FIG. 2 and utilising an interdigitated layout, incorporating the present invention, for impedance matching.

Referring now to FIG. 6, a third novel impedance matching arrangement 600 is similar in principle to the single cell arrangement of FIG. 2 and incorporates an interdigitated layout. The impedance matching arrangement 600 for a dual-band cellular radio power amplifier module has a number of wires 602 attached by conventional wire-bonding techniques between an IC 604 on which is the RF power transistor 606 to be matched, an integrated capacitor 608, a bonding zone 610 and printed transmission line 622. The integrated capacitor 608 is distributed across the IC die, and the wires 602 carrying current respectively from the transistor 606 to the bonding zone 610, from the bonding zone 610 to the integrated capacitor 608 and from the integrated capacitor 608 to the printed transmission line 622 are interdigitated across the die. In this way it will be appreciated that the arrangement 600 possesses all the advantages of the arrangement 200 of FIG. 2 explained above, while additionally allowing more efficient thermal and electrical operation since the RF current conduction is spread across the die.

It will be appreciated that the impedance matching arrangement 600 of FIG. 6, since it is based on a single impedance matching cell like the arrangement 200 of FIG. 2 described above, may likewise be extended to two or more impedance matching cells.

Figure 7:
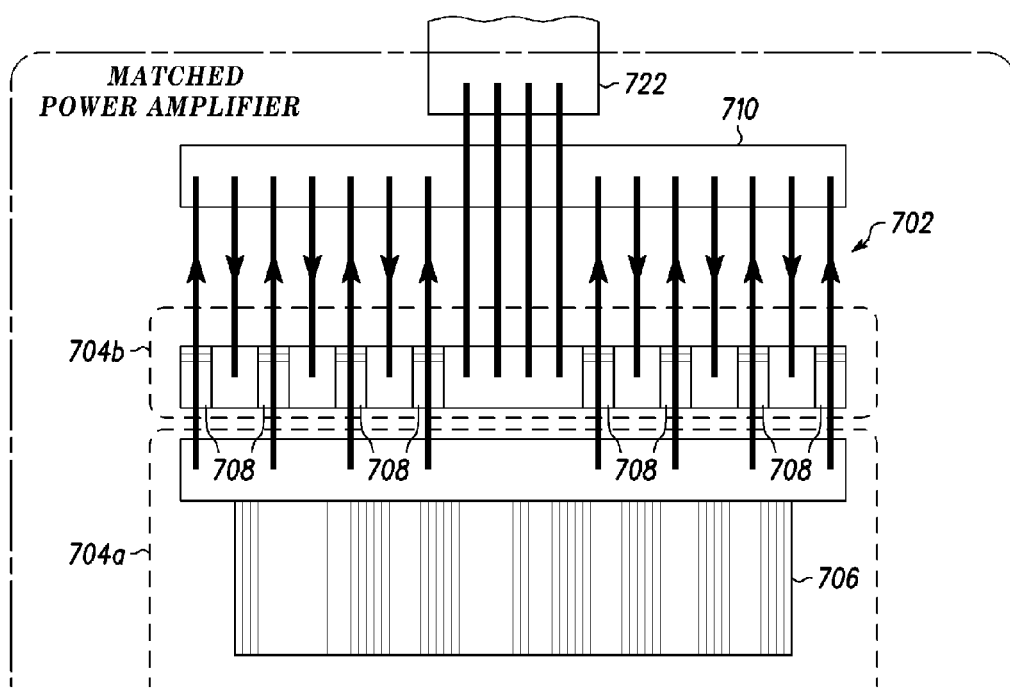
FIG. 7 shows a schematic part-cross-sectional diagram of a fourth novel arrangement similar to that of FIG. 2 and utilising an interdigitated layout with two die, incorporating the present invention, for impedance matching.

Referring now to FIG. 7, a fourth novel impedance matching arrangement 700 is similar in principle to the arrangement 600 of FIG. 6 and incorporates an interdigitated layout while utilizing two different die. The impedance matching arrangement 700 for a dual-band cellular radio power amplifier module has a number of wires 702 attached by conventional wire-bonding techniques between a first IC die 704a on which is the RF power transistor 706 to be matched, a second IC die 704b incorporating an integrated capacitor 708, a bonding zone 710 and printed transmission line 722. As in the arrangement 600 of FIG. 6, the integrated capacitor 708 is distributed across the IC die 704b, and the wires 702 carrying current respectively from the transistor 706 on the IC die 704a to the bonding zone 710, from the bonding zone 710 to the integrated capacitor 708 on the IC die 704b and from the integrated capacitor 708 on the IC die 704b to the printed transmission line 722 are interdigitated across the dies. In this way it will be appreciated that the arrangement 700 possesses all the advantages of the arrangement 200 of FIG. 2 and the added heat distribution advantages of the arrangement 600 of FIG. 6 described above. Additionally, it will be appreciated that the arrangement 700, since it uses two die 704a and 704b, allows the overall cost of the arrangement to be reduced since the size of the die 704a (which is typically a higher cost gallium arsenide semiconductor) can be reduced only to that necessary to provide the RF power transistor 706, while the die 704*b* which provides the integrated capacitor 708 can be a lower cost silicon semiconductor.

It will be appreciated that the impedance matching arrangement 700 of FIG. 7, since it is based on a single impedance matching cell like the arrangement 200 of FIG. 2 and the arrangement 600 of FIG. 6 described above, may likewise be extended to two or more impedance matching cells. In this case, the capacitors required for the second (and any further cells) may all be provided in the lower cost die 704*b*.

It will be appreciated that although the invention has been described above in relation to an RF power amplifier, the invention could alternatively be used at higher or lower frequencies or in other applications requiring impedance transformation, e.g., voltage controlled oscillators (VCOs) or low noise amplifiers (LNAs). It will also be appreciated that the invention can be used in telecommunication applications involving standard modulations such as GSM, CDMA, TDMA, W-CDMA, GPRS, EDGE, UMTS, or other modulation schemes as may be desired.

It will be understood that the arrangement and method for impedance matching described above provides the following advantages:
- easy to implement
- increased accuracy of matching
- requires few external components
- easy to manufacture
- no need for dedicated design flow
- requires only standard IC production and test tools
- uses low loss matching networks
- only a small increase in die size (due to integration of capacitor), but the total size of the solution may be significantly reduced (e.g., by 50%) because of the reduced number of external components.

The invention claimed is:

1. An arrangement for impedance matching an impedance at an input to a different impedance at an output, comprising:
   a first node connected with said input for receiving a current to be impedance matched;
   a second node for receiving current from said first node;
   a first current conductor for carrying current from said first node to said second node; and
   a third node connected with said output for receiving current from said second node;
   a second current conductor for carrying current from said first current conductor; and
   capacitance means coupled to said third node,
   wherein said first node and said third node are provided in respective integrated circuits;
   wherein the first and second current conductors are closely positioned so that their inductance is the sum of their self-inductances reduced by their mutual inductance:
   whereby said impedance matching arrangement matches an impedance presented at said first node to a different impedance presented at said third node.

2. A method for impedance matching an impedance at an input to a different impedance at an output, comprising:
   providing a first node connected with said input for receiving a current to be impedance matched;
   providing a second node for receiving current from said first node;
   providing a first current conductor for carrying current from said first node to said second node;
   providing a third node connected with said output for receiving current from said second node;
   providing a second current conductor for carrying current from said first current conductor; and
   providing capacitance means coupled to said third node,
   wherein said first node and said third node are provided in respective integrated circuits,
   wherein the first and second current conductors are closely positioned so that their inductance is the sum of their self-inductances reduced by their mutual inductance;
   whereby said impedance matching arrangement matches an impedance at said first node to a different impedance at said third node.

* * * * *